United States Patent
Akita et al.

(10) Patent No.: US 9,887,310 B2
(45) Date of Patent: Feb. 6, 2018

(54) SEMICONDUCTOR LAYERED STRUCTURE, METHOD FOR PRODUCING SEMICONDUCTOR LAYERED STRUCTURE, AND METHOD FOR PRODUCING SEMICONDUCTOR DEVICE

(71) Applicant: Sumitomo Electric Industries, Ltd., Osaka-shi (JP)

(72) Inventors: Katsushi Akita, Itami (JP); Kei Fujii, Itami (JP); Takashi Kyono, Itami (JP); Koji Nishizuka, Itami (JP); Kaoru Shibata, Itami (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 15/114,001

(22) PCT Filed: Jan. 19, 2015

(86) PCT No.: PCT/JP2015/051173
§ 371 (c)(1),
(2) Date: Jul. 25, 2016

(87) PCT Pub. No.: WO2015/118926
PCT Pub. Date: Aug. 13, 2015

(65) Prior Publication Data
US 2016/0351742 A1    Dec. 1, 2016

(30) Foreign Application Priority Data

Feb. 5, 2014 (JP) ................................. 2014-020199

(51) Int. Cl.
*H01L 31/109* (2006.01)
*H01L 31/02* (2006.01)
(Continued)

(52) U.S. Cl.
CPC ............ *H01L 31/109* (2013.01); *C30B 29/40* (2013.01); *H01L 21/0262* (2013.01);
(Continued)

(58) Field of Classification Search
CPC ........... H01L 31/109; H01L 31/022408; H01L 31/1844; H01L 31/0392; H01L 31/03046;
(Continued)

(56) References Cited

U.S. PATENT DOCUMENTS

2013/0313521 A1* 11/2013 Akita .............. H01L 31/035209
257/21

FOREIGN PATENT DOCUMENTS

JP    2010-129608 A    6/2010
JP    2012-038766 A    2/2012
(Continued)

OTHER PUBLICATIONS

International Search Report in International Application No. PCT/JP2015/051173, dated Apr. 21, 2015.
(Continued)

*Primary Examiner* — Thanhha Pham
(74) *Attorney, Agent, or Firm* — Venable LLP; Michael A. Sartori; Miguel A. Lopez

(57) ABSTRACT

A semiconductor layered structure includes a substrate formed of a III-V compound semiconductor, a buffer layer disposed on and in contact with the substrate and formed of a III-V compound semiconductor, and a quantum well layer disposed on and in contact with the buffer layer and including a plurality of component layers formed of III-V compound semiconductors. The substrate has a diameter of 55 mm or more. At least one of the component layers is formed of a mixed crystal of three or more elements. When the compound semiconductor forming the substrate has a lattice constant $d_1$, the compound semiconductor forming the buf- (Continued)

fer layer has a lattice constant $d_2$, and the compound semiconductors forming the quantum well layer have an average lattice constant $d_3$, $(d_2-d_1)/d_1$ is $-3\times10^{-3}$ or more and $3\times10^{-3}$ or less, and $(d_3-d_1)/d_1$ is $-3\times10^{-3}$ or more and $3\times10^{-3}$ or less.

10 Claims, 5 Drawing Sheets

(51) Int. Cl.
| | |
|---|---|
| H01L 21/18 | (2006.01) |
| H01L 21/02 | (2006.01) |
| H01L 29/06 | (2006.01) |
| C30B 29/40 | (2006.01) |
| H01L 31/0304 | (2006.01) |
| H01L 31/0352 | (2006.01) |
| H01L 31/105 | (2006.01) |
| H01L 31/0224 | (2006.01) |
| H01L 31/0392 | (2006.01) |
| H01L 31/18 | (2006.01) |

(52) U.S. Cl.
CPC .. *H01L 21/02387* (2013.01); *H01L 21/02463* (2013.01); *H01L 21/02466* (2013.01); *H01L 21/02507* (2013.01); *H01L 21/02546* (2013.01); *H01L 21/02549* (2013.01); *H01L 21/02576* (2013.01); *H01L 21/02579* (2013.01); *H01L 29/06* (2013.01); *H01L 31/022408* (2013.01); *H01L 31/03046* (2013.01); *H01L 31/0392* (2013.01); *H01L 31/035236* (2013.01); *H01L 31/105* (2013.01); *H01L 31/1844* (2013.01); *Y02E 10/544* (2013.01); *Y02P 70/521* (2015.11)

(58) Field of Classification Search
CPC ....... H01L 31/035236; H01L 21/02546; H01L 21/02387; H01L 21/02463; H01L 29/06; H01L 29/7783; H01L 21/182; H01L 21/8252; H01L 21/8258
See application file for complete search history.

(56) References Cited

FOREIGN PATENT DOCUMENTS

| JP | 2012-114464 A | 6/2012 |
|---|---|---|
| JP | 2012-256826 A | 12/2012 |
| JP | 2013-251341 A | 12/2013 |

OTHER PUBLICATIONS

R. Sidhu et al., "A Long-Wavelength Photodiode on InP Using Lattice-Matched GaInAs—GaAsSb Type-II Quantum Wells," IEEE Photonics Technology Letters, vol. 17, No. 12, Dec. 2005, pp. 2715-2717.

* cited by examiner

SEMICONDUCTOR LAYERED STRUCTURE, METHOD FOR PRODUCING SEMICONDUCTOR LAYERED STRUCTURE, AND METHOD FOR PRODUCING SEMICONDUCTOR DEVICE

TECHNICAL FIELD

The present invention relates to a semiconductor layered structure, a method for producing a semiconductor layered structure, and a method for producing a semiconductor device. More specifically, the present invention relates to a semiconductor layered structure, a method for producing a semiconductor layered structure, and a method for producing a semiconductor device that each include a substrate, a buffer layer, and a quantum well layer that are formed of III-V compound semiconductors.

BACKGROUND ART

Operation layers formed of III-V compound semiconductors are formed on a substrate formed of a III-V compound semiconductor, to thereby provide a semiconductor device for near-infrared light, such as a photodiode. Thus, in order to develop photodiodes used for, for example, communications, tests on living bodies, or image capturing at night, various studies have been performed on semiconductor devices including a substrate and operation layers formed of III-V compound semiconductors (for example, refer to Patent Literature 1 and Non Patent Literature 1).

CITATION LIST

Patent Literature

PTL 1: Japanese Unexamined Patent Application Publication No. 2012-256826

Non Patent Literature

NPL 1: R. Sidhu, et al., "A Long-Wavelength Photodiode on InP Using Lattice-Matched GaInAs—GaAsSb Type-II Quantum Wells", IEEE PHOTONICS TECHNOLOGY LETTERS, VOL. 17, NO. 12, DECEMBER 2005, p. 2715-2717

SUMMARY OF INVENTION

Technical Problem

In order to spread the use of such semiconductor devices employing III-V compound semiconductors, the production cost needs to be reduced. The reduction in the production cost can be achieved by using, for example, large-diameter substrates having a diameter of more than 2 inches (about 50 mm) to efficiently produce semiconductor devices.

However, use of large-diameter substrates involves a high probability of occurrence of cracking of substrates in the production process of semiconductor devices, compared with use of small-diameter substrates. As a result, the yield lowers, and the reduction in the production cost of semiconductor devices cannot be achieved, which has been problematic.

Accordingly, an object is to provide a semiconductor layered structure, a method for producing a semiconductor layered structure, and a method for producing a semiconductor device that enable an increase in the yield in the production process of semiconductor devices including a substrate, a buffer layer, and a quantum well layer formed of III-V compound semiconductors.

Solution to Problem

A semiconductor layered structure according to the present invention includes a substrate formed of a III-V compound semiconductor, a buffer layer disposed on and in contact with the substrate and formed of a III-V compound semiconductor, and a quantum well layer disposed on and in contact with the buffer layer and including a plurality of component layers formed of III-V compound semiconductors. The substrate has a diameter of 55 mm or more. At least one of the component layers is formed of a mixed crystal of three or more elements. When the compound semiconductor forming the substrate has a lattice constant $d_1$, the compound semiconductor forming the buffer layer has a lattice constant $d_2$, and the compound semiconductors forming the quantum well layer have an average lattice constant $d_3$, $(d_2-d_1)/d_1$ is $-3\times10^{-3}$ or more and $3\times10^{-3}$ or less, and $(d_3-d_1)/d_1$ is $-3\times10^{-3}$ or more and $3\times10^{-3}$ or less.

A method for producing a semiconductor layered structure according to the present invention includes a step of preparing a substrate formed of a III-V compound semiconductor, a step of growing a buffer layer formed of a III-V compound semiconductor, on and in contact with the substrate, and a step of growing a quantum well layer on and in contact with the buffer layer, the quantum well layer including a plurality of component layers formed of III-V compound semiconductors. The substrate has a diameter of 55 mm or more. At least one of the component layers is formed of a mixed crystal of three or more elements. When the compound semiconductor forming the substrate has a lattice constant $d_1$, the compound semiconductor forming the buffer layer has a lattice constant $d_2$, and the compound semiconductors forming the quantum well layer have an average lattice constant $d_3$, $(d_2-d_1)/d_1$ is $-3\times10^{-3}$ or more and $3\times10^{-3}$ or less, and $(d_3-d_1)/d_1$ is $-3\times10^{-3}$ or more and $3\times10^{-3}$ or less.

Advantageous Effects of Invention

The above-described semiconductor layered structure and method for producing a semiconductor layered structure can provide a semiconductor layered structure and a method for producing a semiconductor layered structure that enable an increase in the yield in the production process of semiconductor devices including a substrate, a buffer layer, and a quantum well layer formed of III-V compound semiconductors.

DESCRIPTION OF EMBODIMENTS

Figure 1:
FIG. 1 is a schematic sectional view illustrating an example of the structure of a semiconductor layered structure.

Description of Embodiments According to the Invention of the Present Application Embodiments according to the invention of the present application will be first listed and described. A semiconductor layered structure according to the present application includes a substrate formed of a III-V compound semiconductor, a buffer layer disposed on and in contact with the substrate and formed of a III-V compound semiconductor, and a quantum well layer disposed on and in contact with the buffer layer and including a plurality of component layers formed of III-V compound semiconductors. The substrate has a diameter of 55 mm or more. At least one of the component layers is formed of a mixed crystal of three or more elements. When the compound semiconductor forming the substrate has a lattice constant $d_1$, the compound semiconductor forming the buffer layer has a lattice constant $d_2$, and the compound semiconductors forming the quantum well layer have an average lattice constant $d_3$, $(d_2-d_1)/d_1$ is $-3\times10^{-3}$ or more and $3\times10^{-3}$ or less, and $(d_3-d_1)/d_1$ is $-3\times10^{-3}$ or more and $3\times10^{-3}$ or less.

In general, in the production process of semiconductor devices including a quantum well layer as an operation layer, it is necessary to reduce occurrence of strain or crystal structure disorder (lattice defect) in the quantum well layer due to, for example, the difference between the lattice constants of the substrate and the quantum well layer. Thus, for example, a buffer layer formed of a crystal is disposed between the substrate and the quantum well layer in some cases, the crystal buffering the difference between the lattice constant of the crystal forming the substrate and the lattice constant of the crystal forming the quantum well layer. In other words, in order to produce semiconductor devices including a quantum well layer with high crystallinity, such an approach is sometimes employed to reduce the difference between the lattice constants of adjacent layers.

However, studies by the inventors of the present invention have revealed that, even when adjacent layers have a sufficiently small difference between their lattice constants, cracking sometimes occurs in the production process of semiconductor devices, resulting in a decrease in the yield. Specifically, a semiconductor layered structure cracks when the semiconductor layered structure considerably warps and the production process of semiconductor devices is performed while the structure is kept flat by a technique such as suction. This problem severely occurs in the cases of using large-diameter substrates having a diameter of 55 mm or more. The inventors of the present invention have found that the occurrence of cracking can be effectively suppressed in the production process of semiconductor devices by adjusting the difference between the lattice constants of adjacent layers that are the substrate and the buffer layer, and also the difference between the lattice constants of the substrate and the quantum well layer, which are disposed with the buffer layer therebetween, to a predetermined value or less, specifically, $3\times10^{-3}$ or less.

In a semiconductor layered structure according to the present application, $(d_2-d_1)/d_1$ is adjusted to $-3\times10^{-3}$ or more and $3\times10^{-3}$ or less, and also $(d_3-d_1)/d_1$ is adjusted to $-3\times10^{-3}$ or more and $3\times10^{-3}$ or less. As a result, the warp of the semiconductor layered structure is reduced to such a level that occurrence of cracking in the production process of semiconductor devices can be effectively suppressed. In this case, as the diameter of the substrate increases, the absolute value of the warp increases. However, as the diameter of the substrate increases, the warp tolerable amount under which occurrence of cracking can be effectively suppressed increases. Accordingly, when the above-described conditions are satisfied, even in the case of using a large substrate having, for example, a diameter of 6 inches (about 152 mm), occurrence of cracking can be effectively suppressed. In summary, a semiconductor layered structure according to the present application enables suppression of occurrence of cracking in the production process of semiconductor devices, to achieve an increase in the yield. Incidentally, the lattice constant $d_1$ of the compound semiconductor forming the substrate, the lattice constant $d_2$ of the compound semiconductor forming the buffer layer, and the average lattice constant $d_3$ of the compound semiconductors forming the quantum well layer can be easily measured by the X-ray diffraction method, for example.

In the semiconductor layered structure, the substrate may have a diameter of 80 mm or more. In this case, semiconductor devices can be efficiently produced. In order to produce semiconductor devices more efficiently, the substrate may have a diameter of 105 mm or more, or 130 mm or more.

The semiconductor layered structure may have a warp of 100 μm or less. In this case, occurrence of cracking in the production process of semiconductor devices can be suppressed with more certainty. Furthermore, when the warp is adjusted to 50 μm or less, occurrence of cracking in the production process of semiconductor devices can be suppressed with even more certainty. Incidentally, in the present application, the "warp" of a semiconductor layered structure denotes, in the semiconductor layered structure placed on a horizontal surface, the distance between the horizontal surface and a portion of a main surface of the semiconductor layered structure, the main surface opposing the horizontal surface, the portion being farthest from the horizontal surface.

In the semiconductor layered structure, the quantum well layer may have a thickness of 1 μm or more. In this case, when the semiconductor layered structure is used to produce semiconductor devices that are photodiodes, the photodiodes can have enhanced sensitivity.

In the semiconductor layered structure, the III-V compound semiconductor forming the substrate may be GaAs (gallium arsenide), GaP (gallium phosphide), GaSb (gallium antimonide), InP (indium phosphide), InAs (indium arsenide), InSb (indium antimonide), AlSb (aluminum antimonide), or AlAs (aluminum arsenide). Semiconductor layered structures including substrates formed of such III-V compound semiconductors are suitable as semiconductor layered structures for producing infrared photodiodes.

In the semiconductor layered structure, at least one of the component layers may contain Sb (antimony). In this case, a semiconductor layered structure can be obtained that is suitable for producing photodiodes for infrared of wavelengths of 1.7 μm or more.

In the semiconductor layered structure, the quantum well layer may have a structure in which an InGaAs (indium gallium arsenide) layer and a GaAsSb (gallium arsenide antimonide) layer as the component layers are alternately stacked. Such a quantum well layer having a structure in which an InGaAs layer and a GaAsSb layer are alternately stacked is suitable as an absorption layer for infrared of wavelengths of 1.7 μm or more. Thus, in this case, a semiconductor layered structure can be obtained that is suitable for producing a photodiode for infrared of wavelengths of 1.7 μm or more.

A method for producing a semiconductor layered structure according to the present application includes a step of preparing a substrate formed of a III-V compound semiconductor, a step of growing a buffer layer formed of a III-V compound semiconductor, on and in contact with the substrate, and a step of growing a quantum well layer including a plurality of component layers formed of III-V compound semiconductors on and in contact with the buffer layer. The substrate has a diameter of 55 mm or more. At least one of the component layers is formed of a mixed crystal of three or more elements. When the compound semiconductor forming the substrate has a lattice constant $d_1$, the compound semiconductor forming the buffer layer has a lattice constant $d_2$, and the compound semiconductors forming the quantum well layer have an average lattice constant $d_3$, $(d_2-d_1)/d_1$ is $-3 \times 10^{-3}$ or more and $3 \times 10^{-3}$ or less, and $(d_3-d_1)/d_1$ is $-3 \times 10^{-3}$ or more and $3 \times 10^{-3}$ or less.

A method for producing a semiconductor layered structure according to the present application is performed such that $(d_2-d_1)/d_1$ is $-3 \times 10^{-3}$ or more and $3 \times 10^{-3}$ or less and also $(d_3-d_1)/d_1$ is $-3 \times 10^{-3}$ or more and $3 \times 10^{-3}$ or less. This enables production of a semiconductor layered structure in which the warp is reduced to such a level that occurrence of cracking in the production process of semiconductor devices can be effectively suppressed.

In the method for producing a semiconductor layered structure, in the step of growing a buffer layer and the step of growing a quantum well layer, the buffer layer and the quantum well layer may be grown by metal-organic vapor phase epitaxy. This enables an increase in the production efficiency of the semiconductor layered structure.

A method for producing a semiconductor device according to the present application includes a step of preparing a semiconductor layered structure produced by the method for producing a semiconductor layered structure, and a step of forming an electrode on the semiconductor layered structure. In the method for producing a semiconductor device according to the present application, the semiconductor layered structure produced by the method for producing a semiconductor layered structure is prepared, to thereby suppress occurrence of cracking in the production process of semiconductor devices. As a result, the method for producing a semiconductor device according to the present application enables production of semiconductor devices at high yield.

[Details of Embodiments According to the Invention of the Present Application]

Hereinafter, a semiconductor layered structure according to an embodiment of the present invention will be described with reference to drawings. Note that the same or corresponding parts in the drawings below are denoted by the same reference sign and the description thereof will not be repeated.

Referring to FIG. 1, a semiconductor layered structure 10 of the embodiment includes a substrate 20, a buffer layer 30, a quantum well layer 40, and a contact layer 50.

The substrate 20 is formed of a III-V compound semiconductor. The substrate 20 has a diameter of 55 mm or more, for example, 3 inches. The III-V compound semiconductor forming the substrate 20 can be selected from, for example, GaAs, GaP, GaSb, InP, InAs, InSb, AlSb, and AlAs. The substrate 20 formed of such a III-V compound semiconductor is employed to thereby provide the semiconductor layered structure 10 suitable for production of infrared photodiodes. For the purpose of increasing the production efficiency and yield of semiconductor devices from the semiconductor layered structure 10, the diameter of the substrate 20 may be 80 mm or more (for example, 4 inches), may be 105 mm or more (for example, 5 inches), or may be 130 mm or more (for example, 6 inches).

The buffer layer 30 is disposed on and in contact with a main surface 20A, which is one of the main surfaces of the substrate 20. The buffer layer 30 is formed of a III-V compound semiconductor. The III-V compound semiconductor forming the buffer layer 30 can be selected from, for example, GaAs, GaP, GaSb, InP, InAs, InSb, AlSb, AlAs, AlGaAs (aluminum gallium arsenide), InGaAs (indium gallium arsenide), and InGaP (indium gallium phosphide). When the compound semiconductor forming the substrate 20 has a lattice constant $d_1$, and the compound semiconductor forming the buffer layer 30 is to have a lattice constant $d_2$, the compound semiconductor forming the buffer layer 30 is selected such that $(d_2-d_1)/d_1$ is $-3 \times 10^{-3}$ or more and $3 \times 10^{-3}$ or less. Specifically, for example, InGaAs of n-type conductivity (n-InGaAs) in which proportions of In and Ga are adjusted so as to satisfy the relationship between $d_1$ and $d_2$ is employed as the compound semiconductor forming the buffer layer 30. As the n-type impurity contained in the buffer layer 30, for example, Si (silicon) can be employed.

The quantum well layer 40 is disposed on and in contact with a main surface 30A of the buffer layer 30, the main surface 30A being on a side of the buffer layer 30 opposite to the other side facing the substrate 20. The quantum well layer 40 has a structure in which two component layers formed of III-V compound semiconductors are alternately stacked. More specifically, the quantum well layer 40 has a structure in which a first component layer 41 and a second component layer 42 are alternately stacked. At least one of the first component layer 41 and the second component layer 42 is formed of a mixed crystal of three or more elements.

When the semiconductor layered structure 10 is used for producing photodiodes, the quantum well layer 40 preferably has a thickness of 1 μm or more. In this case, the photodiodes produced from the semiconductor layered structure 10 can have enhanced sensitivity. When the semiconductor layered structure 10 is used for producing photodiodes for infrared of wavelengths of 1.7 μm or more, at least one of the component layers preferably contains Sb.

When the compound semiconductor forming the substrate 20 has a lattice constant $d_1$, and the compound semiconductors forming the quantum well layer 40 are to have an average lattice constant $d_3$, the compound semiconductors forming the quantum well layer 40 are selected such that $(d_3-d_1)/d_1$ is $-3 \times 10^{-3}$ or more and $3 \times 10^{-3}$ or less. For example, InGaAs and GaAsSb whose constitutional element contents are adjusted so as to satisfy the relationship between $d_1$ and $d_3$ are employed as the III-V compound semiconductors forming the quantum well layer 40. Specifically, as the III-V compound semiconductor forming the first component layer 41, for example, InGaAs can be employed; and, as the III-V compound semiconductor forming the second component layer 42, GaAsSb can be employed. The first component layer 41 and the second component layer 42 may each have a thickness of 5 nm, for example. The quantum well layer 40 may have, for example, a stack of 250 unit structures each constituted by the first component layer 41 and the second component layer 42. Thus, the quantum well layer 40 may have a thickness of, for example, 2.5 μm. The quantum well layer 40 may be formed as a type-II quantum well having such a structure.

The quantum well layer 40 having a structure in which an InGaAs layer and a GaAsSb layer are alternately stacked is suitable as an absorption layer for infrared of wavelengths of 1.7 μm or more. Thus, by employing such a structure, the semiconductor layered structure 10 can be provided so as to be suitable for producing photodiodes for infrared of wavelengths of 1.7 μm or more. Incidentally, the combination of the III-V compound semiconductors forming the first component layer 41 and the second component layer 42 is not limited to the above as long as the relationship between $d_1$ and $d_3$ is satisfied. Examples of the combination include a combination of GaAs (gallium arsenide) and AlGaAs (aluminum gallium arsenide), a combination of InAs (indium arsenide) and InAsSb (indium arsenide antimonide), a combination of GaN (gallium nitride) and AlGaN (aluminum gallium nitride), and a combination of InGaN (indium gallium nitride) and AlGaN (aluminum gallium nitride).

The contact layer 50 is disposed on and in contact with a main surface 40A of the quantum well layer 40, the main surface 40A being on a side of the quantum well layer 40 opposite to the other side facing the buffer layer 30. The contact layer 50 is formed of a III-V compound semiconductor.

Examples of the III-V compound semiconductor forming the contact layer 50 include GaAs, InP, and InGaAs. Specifically, for example, InGaAs of p-type conductivity (p-InGaAs) is employed as the compound semiconductor forming the contact layer 50. As the p-type impurity contained in the contact layer 50, for example, Zn (zinc) may be employed.

In the semiconductor layered structure 10 of the embodiment, the lattice mismatch between the substrate 20 and the buffer layer 30, $(d_2-d_1)/d_1$, is adjusted to $-3 \times 10^{-3}$ or more and $3 \times 10^{-3}$ or less, and also the lattice mismatch between the substrate 20 and the quantum well layer 40, $(d_3-d_1)/d_1$, is adjusted to $-3 \times 10^{-3}$ or more and $3 \times 10^{-3}$ or less. As a result, the warp of the semiconductor layered structure 10 is reduced to such a level that occurrence of cracking in the production process of semiconductor devices can be effectively suppressed. Thus, when the above-described conditions are satisfied, occurrence of cracking can be effectively suppressed even in the case where the substrate 20 is, for example, a large substrate having a diameter of about 130 mm. As a result, use of the semiconductor layered structure 10 of the embodiment enables suppression of occurrence of cracking in the production process of semiconductor devices, to thereby achieve an increase in the yield.

The warp of the semiconductor layered structure 10 is preferably 100 μm or less. In this case, occurrence of cracking in the production process of semiconductor devices can be suppressed with more certainty. Furthermore, when the warp is adjusted to 50 μm or less, occurrence of cracking in the production process of semiconductor devices can be suppressed with even more certainty.

Figure 2:
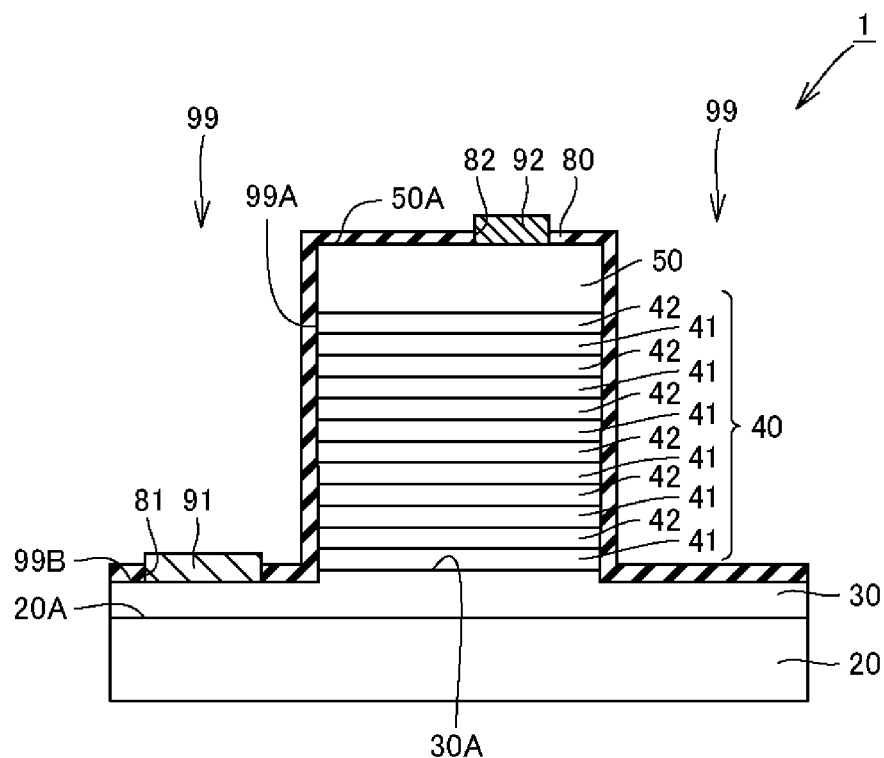
FIG. 2 is a schematic sectional view illustrating an example of the structure of a photodiode.

Hereinafter, an infrared photodiode (photodiode) will be described as an example of semiconductor devices produced from the semiconductor layered structure 10. Referring to FIG. 2, an infrared photodiode 1 according to an embodiment is produced from the semiconductor layered structure 10 according to the above-described embodiment. As with the semiconductor layered structure 10, the infrared photodiode 1 includes the stack of a substrate 20, a buffer layer 30, a quantum well layer 40, and a contact layer 50. In the infrared photodiode 1, a trench 99 is formed so as to extend through the contact layer 50 and the quantum well layer 40 to reach the buffer layer 30. Thus, on a side wall 99A of the trench 99, the contact layer 50 and the quantum well layer 40 are exposed. A bottom wall 99B of the trench 99 is positioned within the buffer layer 30.

The infrared photodiode 1 further includes a passivation film 80, an n-electrode 91, and a p-electrode 92. The passivation film 80 is disposed so as to cover the bottom wall 99B of the trench 99, the side wall 99A of the trench 99, and a main surface 50A of the contact layer 50, the main surface 50A being on a side of the contact layer 50 opposite to the other side facing the quantum well layer 40. The passivation film 80 is formed of an insulator such as silicon nitride or silicon oxide.

The passivation film 80 covering the bottom wall 99B of the trench 99 has an opening 81 extending through the passivation film 80 in the thickness direction. The n-electrode 91 is disposed so as to fill the opening 81. The n-electrode 91 is disposed so as to be in contact with the buffer layer 30 exposed through the opening 81. The n-electrode 91 is formed of an electric conductor such as metal. More specifically, the n-electrode 91 may be formed of, for example, AuGeNi (gold germanium nickel). The n-electrode 91 is in ohmic contact with the buffer layer 30.

The passivation film 80 covering the main surface 50A of the contact layer 50 has an opening 82 extending through the passivation film 80 in the thickness direction. The p-electrode 92 is disposed so as to fill the opening 82. The p-electrode 92 is disposed so as to be in contact with the contact layer 50 exposed through the opening 82. The p-electrode 92 is formed of an electric conductor such as metal. More specifically, the p-electrode 92 may be formed of, for example, AuZn (gold zinc). The p-electrode 92 is in ohmic contact with the contact layer 50.

When infrared rays enter the infrared photodiode 1, the infrared rays are absorbed between quantum levels within the quantum well layer 40, resulting in generation of electron-hole pairs. The generated electrons are output as photocurrent signals from the infrared photodiode 1. Thus, the infrared rays are detected.

Incidentally, the p-electrode 92 is a pixel electrode. Referring to FIG. 2, the infrared photodiode 1 may include only one p-electrode 92 as a pixel electrode; alternatively, the infrared photodiode 1 may include plural pixel electrodes (p-electrodes 92). Specifically, the infrared photodiode 1 may have a structure in which unit structures each illustrated in FIG. 2 are repeated in the direction in which the main surface 20A of the substrate 20 extends in FIG. 2. In this case, while the infrared photodiode 1 has plural p-electrodes 92 corresponding to pixels, only one n-electrode 91 is disposed.

Hereinafter, a method for producing the semiconductor layered structure 10 and the infrared photodiode 1 according to an embodiment will be outlined.

Figure 3:
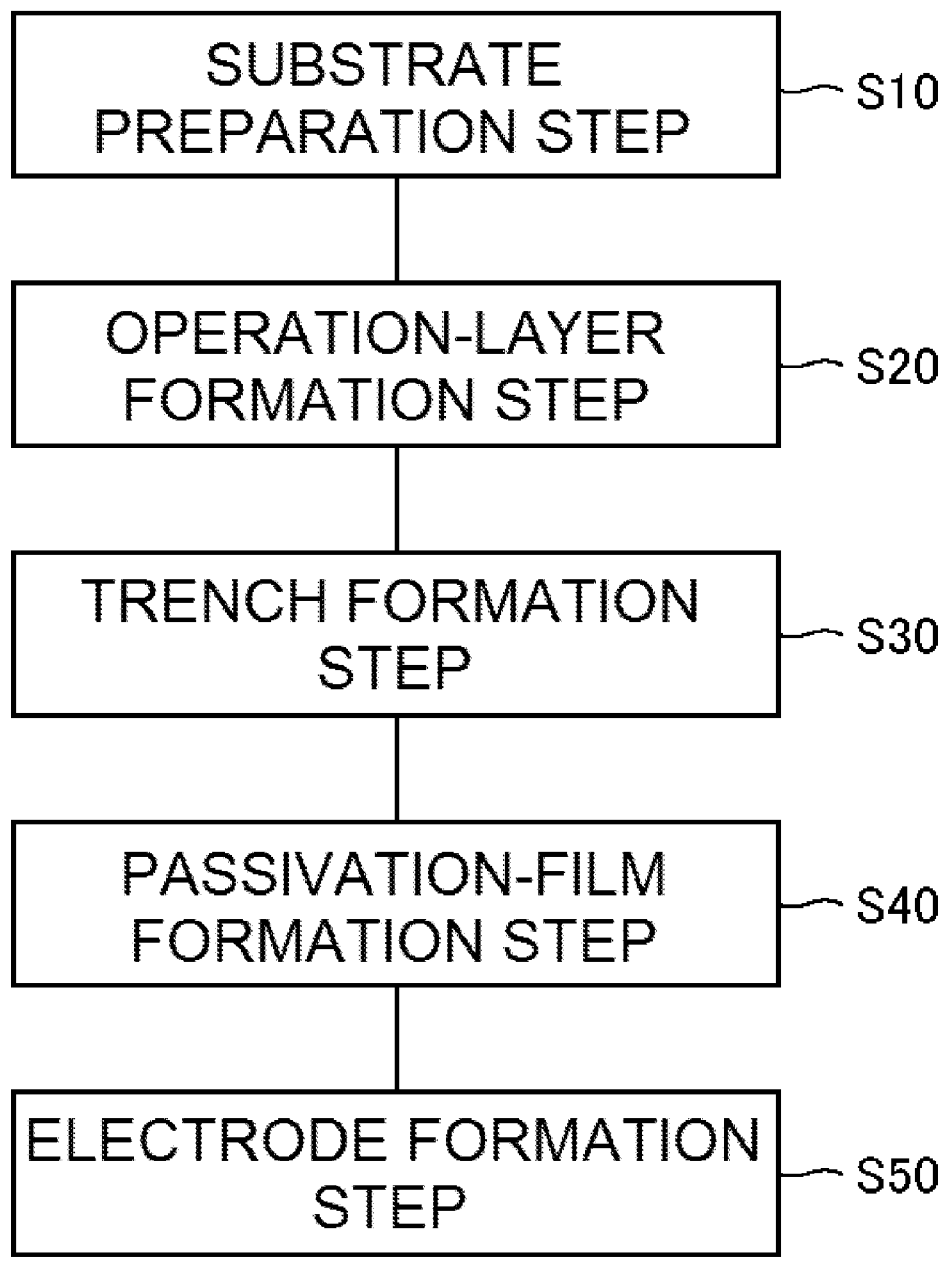
FIG. 3 is a flow chart schematically illustrating a method for producing a semiconductor layered structure and a photodiode.

Referring to FIG. 3, in the method for producing the semiconductor layered structure 10 and the infrared photodiode 1 according to the embodiment, a substrate preparation step is first performed as Step (S10). In this Step (S10), referring to FIG. 4, a substrate 20 is prepared that has a diameter of 4 inches (101.6 mm) and is formed of InP, for example. More specifically, an ingot formed of InP is sliced to obtain the substrate 20 formed of InP. A surface of the substrate 20 is polished and then subjected to processes such as cleaning. Thus, the substrate 20 is prepared in which the planarity and cleanliness of a main surface 20A are ensured.

Subsequently, an operation-layer formation step is performed as Step (S20). In this Step (S20), on the main surface 20A of the substrate 20 prepared in Step (S10), a buffer layer 30, a quantum well layer 40, and a contact layer 50 are formed as operation layers. These operation layers can be formed by, for example, metal-organic vapor phase epitaxy. The formation of the operation layers by metal-organic vapor phase epitaxy can be performed by, for example, placing the substrate 20 on a rotation table equipped with a heater for heating a substrate, and, under heating of the substrate 20 with the heater, supplying source gases onto the substrate.

Figure 4:
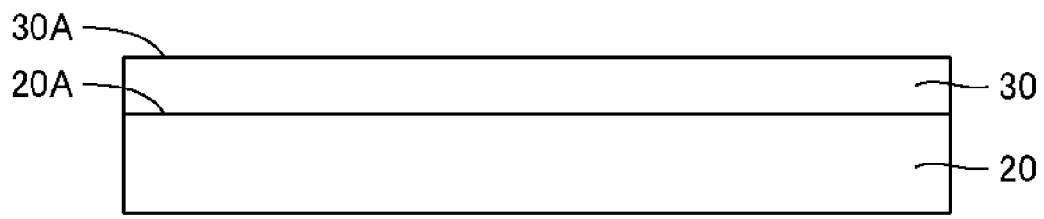
FIG. 4 is a schematic sectional view illustrating an example of a method for producing a semiconductor layered structure and a photodiode.

Specifically, referring to FIG. 4, the buffer layer 30 formed of, for example, n-InGaAs as a III-V compound semiconductor is first formed by metal-organic vapor phase epitaxy so as to be on and in contact with the main surface 20A of the substrate 20. In the formation of the buffer layer 30 formed of n-InGaAs, examples of the In source gas include TMIn (trimethylindium) and TEIn (triethylindium); examples of the Ga source gas include TEGa (triethylgallium) and TMGa (trimethylgallium); and examples of the As source gas include AsH$_3$ (arsine), TBAs (tertiarybutylarsine), and TMAs (trimethylarsenic). When Si is added as an n-type impurity, for example, SiH$_4$ (silane), SiH$_3$ (CH$_3$) (monomethylsilane), or TeESi (tetraethylsilane) may be added to a source gas.

Here, when the compound semiconductor forming the substrate 20 has a lattice constant $d_1$, and the compound semiconductor forming the buffer layer 30 is to have a lattice constant $d_2$, the buffer layer 30 is formed such that $(d_2-d_1)/d_1$ is $-3\times10^{-3}$ or more and $3\times10^{-3}$ or less. Specifically, for example, by controlling the flow rates of source gases to adjust the In and Ga proportions in InGaAs forming the buffer layer 30, the lattice constant $d_2$ can be adjusted to an appropriate value such that the above-described condition is satisfied.

Subsequently, referring to FIGS. 4 and 5, the quantum well layer 40 is formed on and in contact with a main surface 30A of the buffer layer 30, the main surface 30A being on a side of the buffer layer 30 opposite to the other side facing the substrate 20, by alternately stacking, for example, a first component layer 41 formed of InGaAs as a III-V compound semiconductor and a second component layer 42 formed of GaAsSb as a III-V compound semiconductor. Following the formation of the buffer layer 30, the quantum well layer 40 can be continuously formed by metal-organic vapor phase epitaxy. Specifically, while the substrate 20 is disposed within the apparatus having been used for forming the buffer layer 30, the source gases are changed to form the quantum well layer 40.

In the formation of the first component layers 41 formed of InGaAs, examples of the In source gas include TMIn and TEIn; examples of the Ga source gas include TEGa and TMGa; and examples of the As source gas include AsH$_3$, TBAs, and TMAs. In the formation of the second component layers 42 formed of GaAsSb, examples of the Ga source gas include TEGa and TMGa; examples of the As source gas include AsH$_3$, TBAs, and TMAs; and examples of the Sb source gas include TMSb (trimethylantimony), TESb (triethylantimony), TIPSb (triisopropylantimony), and TDMASb (trisdimethylaminoantimony). The first component layers 41 and the second component layers 42 may each be formed so as to have a thickness of, for example, 5 nm; and, for example, 250 unit structures each constituted by the first component layer 41 and the second component layer 42 may be stacked. As a result, a quantum well layer 40 that is a type-II quantum well can be formed.

Here, when the compound semiconductor forming the substrate 20 has a lattice constant $d_1$, and the compound semiconductors forming the quantum well layer 40 are to have an average lattice constant $d_3$, the quantum well layer 40 is formed such that $(d_3-d_1)/d_1$ is $-3\times10^{-3}$ or more and $3\times10^{-3}$ or less. Specifically, for example, by controlling the flow rates of source gases to adjust the composition of the compound semiconductors forming the quantum well layer 40, the lattice constant $d_3$ can be adjusted to an appropriate value such that the above-described condition is achieved. When the first component layer 41 is formed of InGaAs, for example, by changing the proportions of In and Ga, the lattice constant of InGaAs can be adjusted. When the second component layer 42 is formed of GaAsSb, by changing the proportions of As and Sb, the lattice constant of GaAsSb can be adjusted. By combining such adjustments, the average lattice constant $d_3$ of the quantum well layer 40 can be adjusted to an appropriate value such that the above-described condition is achieved.

Subsequently, referring to FIGS. 5 and 1, the contact layer 50 formed of, for example, p-InGaAs as a III-V compound semiconductor is formed on and in contact with a main surface 40A of the quantum well layer 40, the main surface 40A being on a side of the quantum well layer 40 opposite to the other side facing the buffer layer 30. Following the formation of the quantum well layer 40, the contact layer 50 can be continuously formed by metal-organic vapor phase epitaxy. Specifically, while the substrate 20 is disposed within the apparatus having been used for forming the quantum well layer 40, the source gases are changed to form the contact layer 50. In the formation of the contact layer 50 formed of p-InGaAs, examples of the In source gas include TMIn and TEIn; examples of the Ga source gas include TEGa and TMGa; and examples of the As source gas include AsH$_3$, TBAs, and TMAs. When Zn is added as a p-type impurity, for example, DMZn (dimethylzinc) or DEZn (diethylzinc) can be added to a source gas.

The above-described procedures complete the semiconductor layered structure 10 of the embodiment. As described above, by performing Step (S20) by metal-organic vapor phase epitaxy, the production efficiency of the semiconductor layered structure 10 can be enhanced. Alternatively, Step (S20) can be performed by a method other than metal-organic vapor phase epitaxy. For example, MBE (Molecular Beam Epitaxy) may be used.

Figure 6:
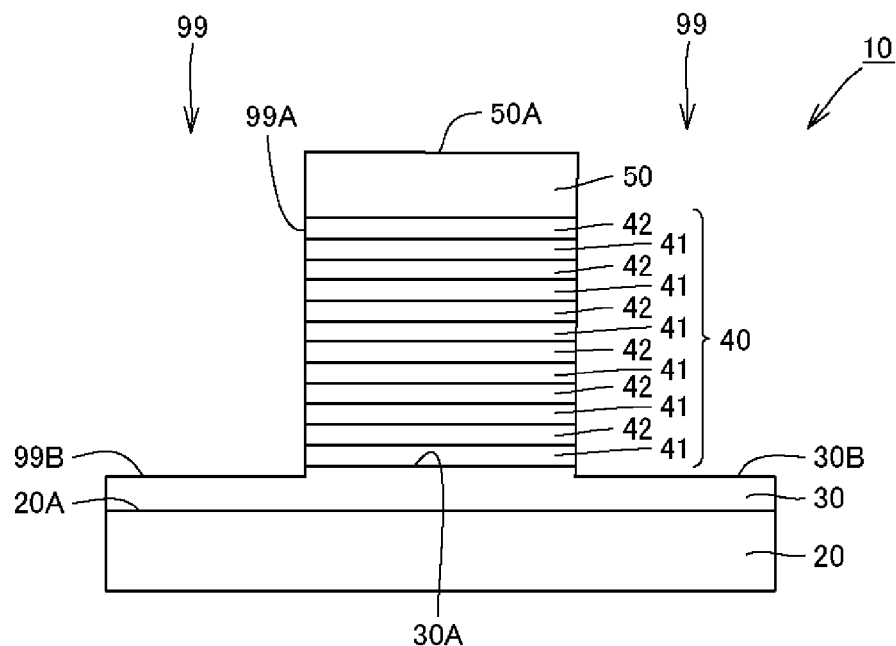
FIG. 6 is a schematic sectional view illustrating an example of a method for producing a semiconductor layered structure and a photodiode.

Subsequently, referring to FIG. 3, a trench formation step is performed as Step (S30). In this Step (S30), referring to FIGS. 1 and 6, in the semiconductor layered structure 10 produced by Steps (S10) and (S20) above, a trench 99 is formed so as to extend through the contact layer 50 and the quantum well layer 40 to reach the buffer layer 30. The trench 99 can be formed by, for example, forming a mask layer having an opening corresponding to the shape of the trench 99, on a main surface 50A of the contact layer 50, and then performing etching.

Figure 7:
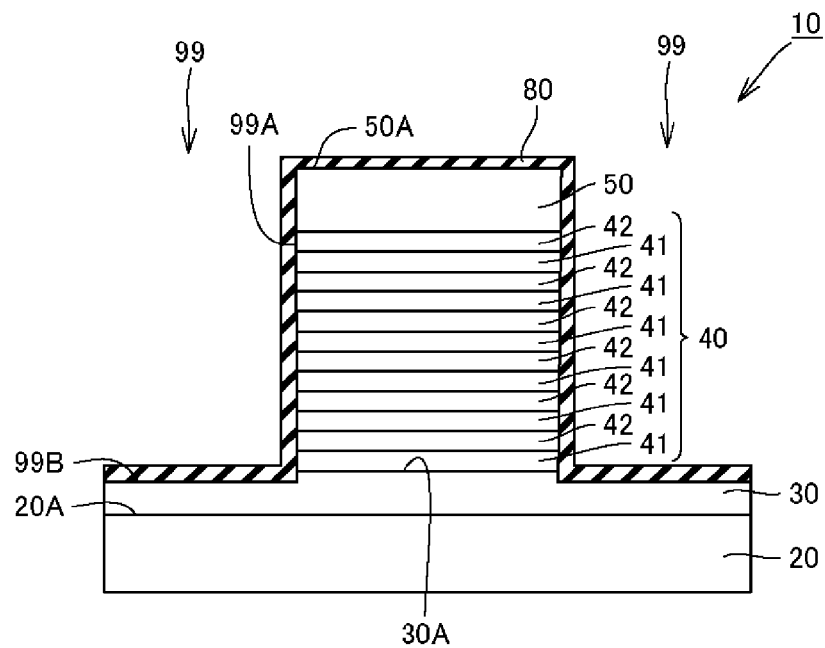
FIG. 7 is a schematic sectional view illustrating an example of a method for producing a semiconductor layered structure and a photodiode.

Subsequently, a passivation-film formation step is performed as Step (S40). In this Step (S40), referring to FIGS. 6 and 7, in the semiconductor layered structure 10 having the trench 99 formed in Step (S30), a passivation film 80 is formed. Specifically, for example, CVD (Chemical Vapor Deposition) is performed to form the passivation film 80 formed of an insulator such as silicon oxide or silicon nitride. The passivation film 80 is formed so as to cover a bottom wall 99B of the trench 99, a side wall 99A of the trench 99, and the main surface 50A of the contact layer 50, the main surface 50A being on a side of the contact layer 50 opposite to the other side facing the quantum well layer 40.

Subsequently, an electrode formation step is performed as Step (S50). In this Step (S50), referring to FIGS. 7 and 2, in the semiconductor layered structure 10 having the passivation film 80 formed in Step (S40), an n-electrode 91 and a p-electrode 92 are formed. Specifically, for example, a mask having openings at positions corresponding to regions where the n-electrode 91 and the p-electrode 92 are to be formed, is formed on the passivation film 80; and the passivation film 80 is etched through the mask to form openings 81 and 82. After that, for example, vapor deposition is performed to form the n-electrode 91 and the p-electrode 92 formed of appropriate electric conductors. The steps having been described complete the infrared photodiode 1 according to the embodiment. After that, for example, dicing is performed to provide separate elements.

In the semiconductor layered structure 10 according to the embodiment, the lattice mismatch between the substrate 20 and the buffer layer 30, $(d_2-d_1)/d_1$, is adjusted to $-3\times10^{-3}$ or more and $3\times10^{-3}$ or less, and also the lattice mismatch between the substrate 20 and the quantum well layer 40, $(d_3-d_1)/d_1$, is adjusted to $-3\times10^{-3}$ or more and $3\times10^{-3}$ or less. As a result, the warp of the semiconductor layered structure 10 is reduced to such a level that occurrence of cracking can be effectively suppressed in the production process of the infrared photodiode 1 as a semiconductor device. Thus, the semiconductor layered structure and the production method therefor according to the embodiments enable suppression of occurrence of cracking in the production process of the infrared photodiode 1 as a semiconductor device, to achieve an increase in the yield.

The semiconductor layered structure 10 according to the embodiment preferably has a warp of 100 μm or less. As described above, the warp tolerance value in terms of occurrence of cracking increases with an increase in the diameter of the substrate. By adjusting the warp to 100 μm or less, occurrence of cracking can be effectively suppressed in the case of using a substrate having a diameter of 55 mm or more.

In the method for producing the infrared photodiode 1 as a semiconductor device according to the embodiment, the semiconductor layered structure 10 according to the embodiment is used to produce the infrared photodiode 1. Thus, in the method for producing the infrared photodiode 1 according to the embodiment, occurrence of cracking in the production process is suppressed, to achieve an increase in the yield.

Example 1

In the production process of semiconductor devices, the relationship between substrate size and substrate material utilization was examined. Specifically, in the cases where substrates having diameters of 2 inches to 6 inches are used to produce photodiodes having a planar shape of a length of 10 mm and a width of 8.5 mm, the number of elements (chips) obtained and a substrate utilization efficiency (ratio of the area used for producing elements to the area of a main surface of the substrate) were calculated. The calculations were performed on the premise that, since the cutting margin necessary for dividing elements (chips) from a substrate is about 10% relative to the planar shape of elements, each element requires an area of a length of 11 mm and a width of 9.4 mm. The results are described in Table 1.

TABLE 1

|  | 2 inches | 3 inches | 4 inches | 5 inches | 6 inches |
| --- | --- | --- | --- | --- | --- |
| Number of chips obtained | 11 | 28 | 52 | 88 | 136 |
| Utilization efficiency (%) | 48 | 54 | 56 | 61 | 65 |

Referring to Table 1, as the diameter of a substrate increases, the number of chips obtained increases and also the substrate utilization efficiency increases. This means that an increase in the diameter of a substrate results in an increase in the number of elements produced and an increase in the production efficiency, and also results in an increase in the substrate material utilization. In particular, since photodiodes often have a large planar shape, employment of a large-diameter substrate exerts a strong effect of increasing the substrate utilization efficiency. Accordingly, by setting the diameter of the substrate to 55 mm or more, for example, 3 inches (76.2 mm), production efficiency and material utilization are increased. By setting the diameter of the substrate to 80 mm or more, for example, 4 inches (101.6 mm), production efficiency and material utilization are further increased. In order to further increase production efficiency and material utilization, the diameter of the substrate is preferably set to 105 mm or more, for example, 5 inches (127 mm); more preferably, the diameter of the substrate is set to 130 mm or more, for example, 6 inches (152.4 mm).

Example 2

An experiment of examining the relationship between lattice mismatch and warp of a semiconductor layered structure was performed. The procedures of the experiment are as follows.

Figure 5:
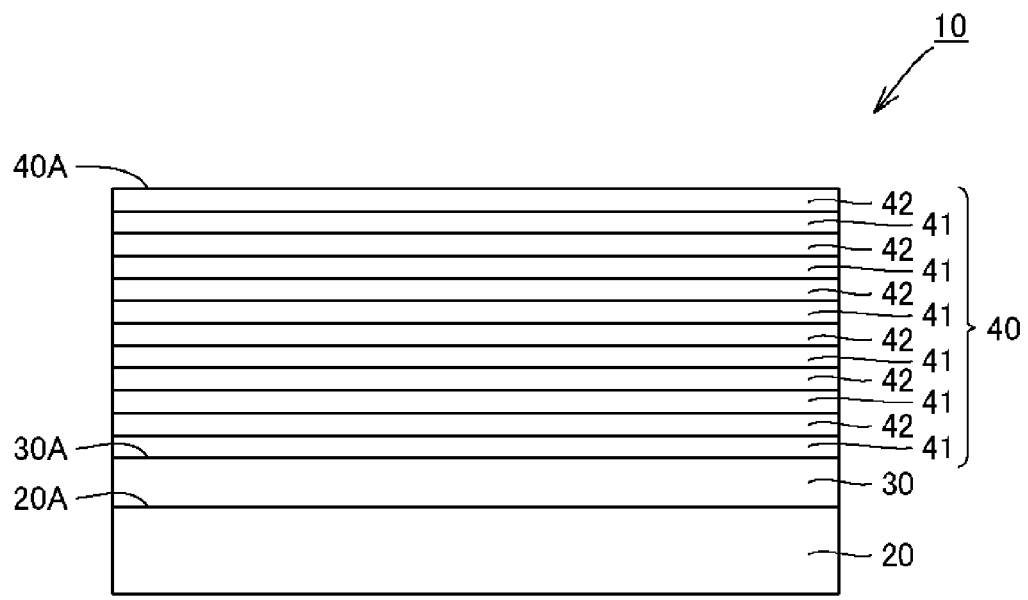
FIG. 5 is a schematic sectional view illustrating an example of a method for producing a semiconductor layered structure and a photodiode.

Referring to FIG. 5, on a substrate 20 formed of InP and having a diameter of 2 inches, a buffer layer 30 formed of n-InGaAs was first formed; and, on the buffer layer 30, a quantum well layer 40 in which a first component layer 41 formed of InGaAs and a second component layer 42 formed of GaAsSb were alternately stacked was formed. Thus, a semiconductor layered structure 10 having the structure in FIG. 5 was produced. The layers were formed in the same manner as in the above-described embodiment. At this time, the In and Ga proportions of n-InGaAs forming the buffer layer 30 were adjusted such that the lattice mismatch between the buffer layer 30 and the substrate 20, $(d_2-d_1)/d_1$, was $-1\times10^4$ or more and $1\times10^4$ or less. In addition, by adjusting the In and Ga proportions of InGaAs forming the first component layer 41 and the As and Sb proportions of GaAsSb forming the second component layer 42, the lattice mismatch between the quantum well layer 40 and the substrate 20, $(d_3-d_1)/d_1$, was varied in the range of $-4\times10^{-3}$ to $4\times10^{-3}$. In this way, under conditions that $(d_2-d_1)/d_1$ was close to 0, plural semiconductor layered structures 10 differing in $(d_3-d_1)/d_1$ were produced and each semiconductor layered structure 10 was measured in terms of warp. The results of the experiment are illustrated in FIG. 8.

Figure 8:
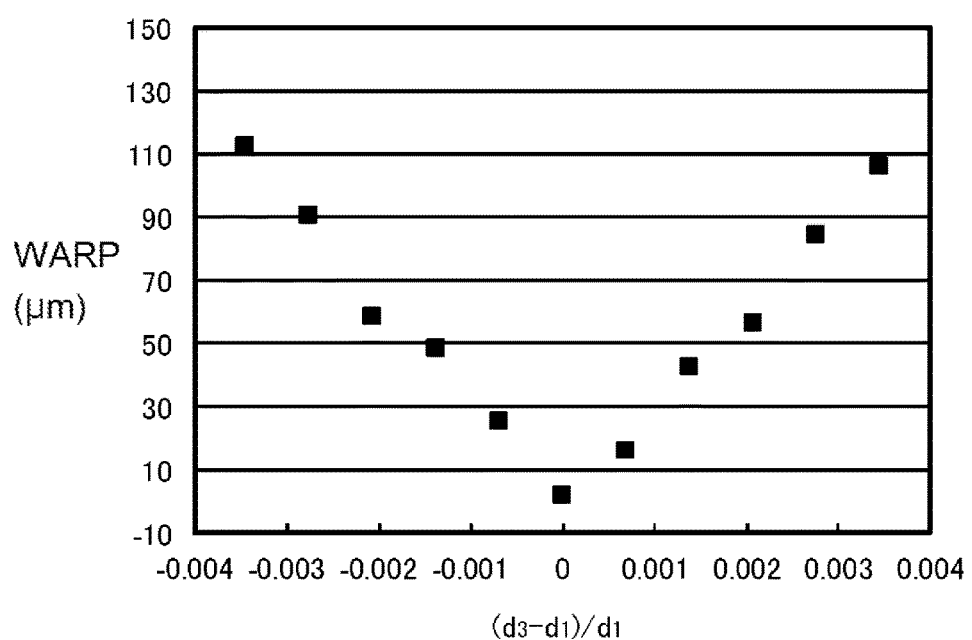
FIG. 8 is a graph indicating the relationship between the warp of a semiconductor layered structure and the lattice mismatch between a substrate and a quantum well layer.

In FIG. 8, the abscissa axis indicates the lattice mismatch between the quantum well layer 40 and the substrate 20, $(d_3-d_1)/d_1$, and the ordinate axis indicates the warp of the semiconductor layered structure 10. Referring to FIG. 8, as the difference of the value of $(d_3-d_1)/d_1$ from 0 increases, the warp of the semiconductor layered structure 10 increases. When a substrate 20 having a diameter of 2 inches is employed as described above, by adjusting $(d_3-d_1)/d_1$ to $-3\times10^{-3}$ or more and $3\times10^{-3}$ or less, the warp is reduced to 100 μm or less. In the production steps of semiconductor devices, the steps are performed while the semiconductor layered structure is straightened to reduce its warp by a technique such as suction. When the warp is large, straightening causes large distortion of the semiconductor layered structure; when the distortion exceeds the tolerance value, cracking occurs. The warp tolerance value in terms of occurrence of cracking increases with an increase in the diameter of the substrate. When a semiconductor layered structure 10 including a substrate 20 having a diameter of 2 inches (50.8 mm) is used for producing semiconductor devices, by adjusting the warp to 100 μm or less, the probability of occurrence of cracking is sufficiently decreased. This indicates that, by adjusting the warp to 100 μm or less, when a substrate having a diameter of 55 mm or more is used, occurrence of cracking can be effectively suppressed.

Example 3

An experiment was performed in which the ratio of occurrence of cracking in the production process of semiconductor devices was examined in terms of semiconductor layered structures varying in the lattice mismatch between the substrate and the buffer layer, $(d_2-d_1)/d_1$, the lattice mismatch between the substrate and the quantum well layer, $(d_3-d_1)/d_1$, or the lattice mismatch between the buffer layer and the quantum well layer, $(d_3-d_2)/d_2$. The procedures of the experiment are as follows.

A substrate 20 having a diameter of 6 inches (152.4 mm) and formed of InP was first prepared. In the same manner as in the above-described embodiment, the following layers were formed on the substrate 20: a buffer layer 30 formed of n-InGaAs, a quantum well layer 40 in which a first component layer 41 formed of InGaAs and a second component layer 42 formed of GaAsSb were alternately stacked, and a contact layer 50 formed of p-InGaAs. Thus, a semiconductor layered structure 10 illustrated in FIG. 1 was produced. This semiconductor layered structure 10 was further subjected to Steps (S30) to (S50) of the above-described embodiment, to produce infrared photodiodes 1 illustrated in FIG. 2. The photodiodes were, without being divided into elements, examined as to whether cracking occurred or not. The results of the experiment are described in Table 2 to Table 4.

TABLE 4

|  | Sample No. 15 | Sample No. 16 | Sample No. 17 | Sample No. 18 | Sample No. 19 |
|---|---|---|---|---|---|
| In proportion of InGaAs buffer layer | 0.55 | 0.55 | 0.55 | 0.55 | 0.55 |
| $(d_2-d_1)/d_1$ $(\times 10^{-3})$ | 1.3 | 1.3 | 1.3 | 1.3 | 1.3 |
| $(d_3-d_2)/d_2$ $(\times 10^{-3})$ | 0.0 | 0.7 | 1.4 | 2.1 | 2.8 |
| $(d_3-d_1)/d_1$ $(\times 10^{-3})$ | 1.3 | 2.0 | 2.7 | 3.4 | 4.1 |
| Ratio of occurrence of cracking (%) | 0 | 10 | 20 | 80 | 90 |
| Evaluation | Excellent | Good | Good | Poor | Poor |

Table 2 describes the examination results of the ratio of occurrence of cracking in terms of the cases where $(d_3-d_1)/d_1$ is $-1\times 10^4$ or more and $1\times 10^4$ or less, in other words, $(d_3-d_1)/d_1$ is close to 0, and $(d_2-d_1)/d_1$ is varied. Table 3 describes the examination results of the ratio of occurrence of cracking in terms of cases where $(d_2-d_1)/d_1$ is $-1\times 10^{-4}$ or more and $1\times 10^4$ or less, in other words, $(d_2-d_1)/d_1$ is close to 0, and $(d_3-d_1)/d_1$ is varied. Table 4 describes the examination results of the ratio of occurrence of cracking in terms of the cases where $(d_2-d_1)/d_1$ is adjusted to $1.3\times 10^{-3}$ (constant) and $(d_3-d_2)/d_2$ is varied.

Referring to Table 2, although $(d_3-d_1)/d_1$ is sufficiently small, when $(d_2-d_1)/d_1$ is outside the range of $-3\times 10^{-3}$ or more and $3\times 10^{-3}$ or less, the ratios of occurrence of cracking are high. In contrast, by adjusting $(d_2-d_1)/d_1$ to be within the range of $-3\times 10^{-3}$ or more and $3\times 10^{-3}$ or less, the ratio of occurrence of cracking can be reduced even to 20% or less. In addition, by adjusting $(d_2-d_1)/d_1$ to be within the range of $-1.4\times 10^{-3}$ or more and $1.4\times 10^{-3}$ or less, the ratio of occurrence of cracking can be further reduced.

Referring to Table 3, although $(d_2-d_1)/d_1$ is sufficiently small, when $(d_3-d_1)/d_1$ is outside the range of $-3\times 10^{-3}$ or more and $3\times 10^{-3}$ or less, the ratios of occurrence of cracking are high. In contrast, by adjusting $(d_3-d_1)/d_1$ to be within the range of $-3\times 10^{-3}$ or more and $3\times 10^{-3}$ or less, the ratio of occurrence of cracking can be reduced even to 20% or less. In addition, by adjusting $(d_3-d_1)/d_1$ to be within the range of

TABLE 2

|  | Sample No. 1 | Sample No. 2 | Sample No. 3 | Sample No. 4 | Sample No. 5 | Sample No. 6 | Sample No. 7 |
|---|---|---|---|---|---|---|---|
| In proportion of InGaAs buffer layer | 0.43 | 0.45 | 0.49 | 0.53 | 0.57 | 0.61 | 0.63 |
| $(d_2-d_1)/d_1$ $(\times 10^{-3})$ | -3.5 | -2.8 | -1.4 | 0 | 1.4 | 2.7 | 3.4 |
| Ratio of occurrence of cracking (%) | 90 | 20 | 0 | 0 | 0 | 10 | 80 |
| Evaluation | Poor | Good | Excellent | Excellent | Excellent | Good | Poor |

TABLE 3

|  | Sample No. 8 | Sample No. 9 | Sample No. 10 | Sample No. 11 | Sample No. 12 | Sample No. 13 | Sample No. 14 |
|---|---|---|---|---|---|---|---|
| $(d_3-d_1)/d_1$ $(\times 10^{-3})$ | -3.7 | -2.9 | -1.4 | 0.1 | 1.4 | 2.9 | 3.7 |
| Ratio of occurrence of cracking (%) | 90 | 20 | 0 | 0 | 0 | 20 | 80 |
| Evaluation | Poor | Good | Excellent | Excellent | Excellent | Good | Poor |

−1.4×10$^{-3}$ or more and 1.4×10$^{-3}$ or less, the ratio of occurrence of cracking can be further reduced.

Referring to Table 4, although $(d_2-d_1)/d_1$ and $(d_3-d_2)/d_2$ are both within the range of −3×10$^{-3}$ or more and 3×10$^{-3}$ or less, when $(d_3-d_1)/d_1$ is outside the range of −3×10$^{-3}$ or more and 3×10$^{-3}$ or less, the ratios of occurrence of cracking are high. In other words, by simply adjusting the lattice mismatch between adjacent layers to be within the range of −3×10$^{-3}$ or more and 3×10$^{-3}$ or less, in some cases, the ratio of occurrence of cracking cannot be sufficiently reduced.

The above-described experiment results have demonstrated that, by simultaneously adjusting $(d_2-d_1)/d_1$ and $(d_3-d_1)/d_1$ to be within the range of −3×10$^{-3}$ or more and 3×10$^{-3}$ or less, the ratio of occurrence of cracking is effectively reduced. When the lattice mismatch is fixed, as the diameter of the substrate increases, the warp increases but simultaneously the warp tolerance value in terms of occurrence of cracking increases. For this reason, when the substrate has a diameter of 55 mm or more, regardless of the diameter of the substrate, as long as conditions that $(d_2-d_1)/d_1$ and $(d_3-d_1)/d_1$ are simultaneously adjusted to be within the range of −3×10$^{-3}$ or more and 3×10$^{-3}$ or less are satisfied, the ratio of occurrence of cracking is effectively reduced.

The embodiments and EXAMPLES disclosed herein are mere examples in all respects and should be understood as being non-limitative in any perspective. The scope of the present invention is defined not by the above-described description but by Claims. The scope of the present invention is intended to embrace all the modifications within the meaning and range of equivalency of the Claims.

INDUSTRIAL APPLICABILITY

In particular, a semiconductor layered structure, a method for producing a semiconductor layered structure, and a method for producing a semiconductor device according to the present application are advantageously applicable to a semiconductor layered structure, a method for producing a semiconductor layered structure, and a method for producing a semiconductor device that each include a substrate, a buffer layer, and a quantum well layer that are formed of III-V compound semiconductors.

REFERENCE SIGNS LIST 1 infrared photodiode 10 semiconductor layered structure 20 substrate 20A main surface of substrate 30 buffer layer 30A main surface of buffer layer 40 quantum well layer 40A main surface of quantum well layer 41 first component layer 42 second component layer 50 contact layer
50A main surface of contact layer 80 passivation film 81, 82 openings 91 n-electrode 92 p-electrode 99 trench 99A side wall
99B bottom wall

The invention claimed is:

1. A semiconductor layered structure comprising:
a substrate formed of a III-V compound semiconductor;
a buffer layer disposed on and in contact with the substrate and formed of a III-V compound semiconductor; and
a quantum well layer disposed on and in contact with the buffer layer and including a plurality of component layers formed of III-V compound semiconductors,
wherein the substrate has a diameter of 55 mm or more,
at least one of the component layers is formed of a mixed crystal of three or more elements, and
when the compound semiconductor forming the substrate has a lattice constant $d_1$, the compound semiconductor forming the buffer layer has a lattice constant $d_2$, and the compound semiconductors forming the quantum well layer have an average lattice constant $d_3$, $(d_2-d_1)/d_1$ is −3×10$^{-3}$ or more and 3×10$^{-3}$ or less, and $(d_3-d_1)/d_1$ is −3×10$^{-3}$ or more and 3×10$^{-3}$ or less.

2. The semiconductor layered structure according to claim 1, wherein the substrate has a diameter of 80 mm or more.

3. The semiconductor layered structure according to claim 1, having a warp of 100 μm or less.

4. The semiconductor layered structure according to claim 1, wherein the quantum well layer has a thickness of 1 μm or more.

5. The semiconductor layered structure according to claim 1, wherein the III-V compound semiconductor forming the substrate is GaAs, GaP, GaSb, InP, InAs, InSb, AlSb, or AlAs.

6. The semiconductor layered structure according to claim 1, wherein at least one of the component layers contains Sb.

7. The semiconductor layered structure according to claim 1, wherein the quantum well layer has a structure in which an InGaAs layer and a GaAsSb layer as the component layers are alternately stacked.

8. A method for producing a semiconductor layered structure, comprising:
a step of preparing a substrate formed of a III-V compound semiconductor;
a step of growing a buffer layer formed of a III-V compound semiconductor, on and in contact with the substrate; and
a step of growing a quantum well layer on and in contact with the buffer layer, the quantum well layer including a plurality of component layers formed of III-V compound semiconductors,
wherein the substrate has a diameter of 55 mm or more,
at least one of the component layers is formed of a mixed crystal of three or more elements, and, when the compound semiconductor forming the substrate has a lattice constant $d_1$, the compound semiconductor forming the buffer layer has a lattice constant $d_2$, and the compound semiconductors forming the quantum well layer have an average lattice constant $d_3$, $(d_2-d_1)/d_1$ is −3×10$^{-3}$ or more and 3×10$^{-3}$ or less, and $(d_3-d_1)/d_1$ is −3×10$^{-3}$ or more and 3×10$^{-3}$ or less.

9. The method for producing a semiconductor layered structure according to claim 8, wherein, in the step of growing a buffer layer and the step of growing a quantum well layer, the buffer layer and the quantum well layer are grown by metal-organic vapor phase epitaxy.

10. A method for producing a semiconductor device, comprising: a step of preparing a semiconductor layered structure produced by the method for producing a semiconductor layered structure according to claim 8, and a step of forming an electrode on the semiconductor layered structure.

* * * * *